(12) United States Patent
Wei

(10) Patent No.: US 6,918,807 B2
(45) Date of Patent: Jul. 19, 2005

(54) MANUFACTURING METHODS OF TRANSPARENT ELECTRODE PLATES AND ORGANIC FLAT EMITTING DEVICES

(75) Inventor: Mao-Kuo Wei, Hsin Chu (TW)

(73) Assignee: RiTdisplay Corporation (TW)

( * ) Notice: Subject to any disclaimer, the term of this patent is extended or adjusted under 35 U.S.C. 154(b) by 215 days.

(21) Appl. No.: 10/322,726

(22) Filed: Dec. 19, 2002

(65) Prior Publication Data

US 2003/0119414 A1 Jun. 26, 2003

(30) Foreign Application Priority Data

Dec. 21, 2001 (TW) .......................... 90131950 A
Dec. 21, 2001 (TW) .......................... 90131951 A

(51) Int. Cl.[7] .......................... H01J 9/00; H05B 33/10
(52) U.S. Cl. .......................... 445/24; 445/25; 427/66
(58) Field of Search .................. 445/24, 25; 313/504, 313/509, 506; 427/66; 428/690

(56) References Cited

U.S. PATENT DOCUMENTS 5,742,129 A * 4/1998 Nagayama et al. ......... 313/498
6,150,668 A * 11/2000 Bao et al. .................. 313/504
6,653,779 B1 * 11/2003 Lu .............................. 313/505

FOREIGN PATENT DOCUMENTS

JP          2001068268 A  *  3/2001  .......... H05B/33/10

* cited by examiner

Primary Examiner—Maricelli Santiago
(74) Attorney, Agent, or Firm—Birch, Stewart, Kolasch & Birch, LLP

(57) ABSTRACT

A manufacturing method of organic flat emitting devices, including a transparent electrode substrate forming step, an insulation layer forming step, a curing step, an organic electroluminescent layer forming step, and a metallic cathode forming step. In the transparent electrode substrate forming step, a plurality of separate transparent anodes are formed on a transparent substrate. In the insulation layer forming step, an insulation layer is formed around the transparent anode by ink-jet printing. In the curing step, the insulation layer is cured to form a transparent electrode plate. In the organic electroluminescent layer forming step, an organic electroluminescent layer is formed on the transparent electrode plate having the transparent anode and the insulation layer formed thereon. In the metallic cathode forming step, metallic cathodes 13 are formed on the organic electroluminescent layer. Furthermore, the invention also discloses a manufacturing method of transparent electrode plates.

19 Claims, 11 Drawing Sheets

MANUFACTURING METHODS OF TRANSPARENT ELECTRODE PLATES AND ORGANIC FLAT EMITTING DEVICES

BACKGROUND OF THE INVENTION

1. Field of the Invention

The invention relates to manufacturing methods of transparent electrode plates and organic flat emitting devices and, in particular, to manufacturing methods of transparent electrode plates and organic flat emitting devices having an insulation layer manufactured utilizing ink-jet printing technology.

2. Description of the Related Art

In recent years, light emitting devices are developed toward the trend of higher brightness, higher flatness, more compact, and lower power consumption. Therefore, OLED (organic light-emitting diode) or organic electroluminescent devices have become an important technology in the optical-electronic industry.

Referring to FIG. 1, the basic structure of a general organic light-emitting device 2 includes a transparent electrode plate 21, an organic electroluminescent layer 22, and a metallic cathode 23. The transparent electrode plate 21 includes a transparent substrate 211, a plurality of transparent anodes 212, and an insulation layer 213. FIG. 2A to FIG. 2C illustrate the conventional manufacturing method of the transparent electrode plate 21. First, referring to FIG. 2A, a transparent anode layer is coated on the transparent substrate 211. Then, an anode pattern shown in FIG. 2B is formed using lithography technology. Next, a polymer material with high resistance is spin-coated thereon. Afterwards, the pattern of the insulation layer 213 shown in FIG. 2C is formed using lithography technology. During the lithography process, photoresist and organic solution, such as developer and stripper, are required, and may cause environment pollution.

Conventionally, there are three major processes to manufacture the insulation layer. In the first process, photoresist-type polymer solution is employed to form the insulation layer, and is coated on the transparent substrate by spin coating and baking so as to form an insulation film. Then, the insulation layer structure is formed sequentially by exposing, baking, developing and baking. In the second process, non-photoresist-type polymer solution is used as the material of the insulation layer. The non-photoresist-type polymer solution is coated on the transparent substrate by spin coating and baking to form an insulation film. Then, the insulation layer structure is formed sequentially by photoresist coating, baking, exposing, developing, insulation layer etching, photoresist stripping and baking. In the third process, photosensitive/non-photosensitive polymer solution is used to form the insulation layer by screen-printing. To form the insulation layer by screen-printing, a screen having a specific pattern is placed on a substrate, and the insulation layer structure is formed by utilizing printing and curing (exposing/heating).

The first and second processes of manufacturing the transparent electrode plates mentioned above are both complex and time-consuming, and require various kinds of expensive manufacturing machines. The usage rate of the insulation layer material is very low (less than 10%), and the organic solution used during process causes environmental problems. The third process is simple and fast, but it still has the problems of low resolution of the insulation layer structure (larger than 150 m) and low material usage rate of the insulation layer (20% to 50%). The third process also occurs environmental problems, because large amount of organic solution is required to wash the screen.

To sum up, the manufacturing methods of organic flat emitting devices have the problems of various expensive manufacture machines, complex and time-consuming process, high costs, and environmental problems caused by using large amount of organic solution and photoresist. Furthermore, the fabrication of photomasks and screens further lengthens the manufacture cycle and raises the manufacture cost.

SUMMARY OF THE INVENTION

In view of the above, an objective of the invention is to provide manufacturing methods of organic flat emitting devices and transparent electrode plates, which has the advantages of low cost, short manufacturing cycle, and low environmental pollution.

To achieve the above-mentioned objective, the invention provides manufacturing methods of organic flat emitting devices, which has a transparent electrode plate, an organic electroluminescent layer, and a metallic cathode. The manufacturing method includes a transparent electrode substrate forming step, an insulation layer forming step, a curing step, an organic electroluminescent layer forming step, and a metallic cathode forming step.

In the transparent electrode plate forming step, a plurality of separated transparent anodes are formed on a transparent substrate. In the insulation layer forming step, an insulation layer is formed around the transparent anode by inkjet printing. In the curing step, the insulation layer is cured to form a transparent electrode plate. In the organic electroluminescent layer forming step, an organic electroluminescent layer is formed on the transparent electrode plate having the transparent anode and the insulation layer formed thereon. In the metallic cathode forming step, metallic cathodes are formed on the organic electroluminescent layer.

Comparing with the conventional processes, the insulation layer of the transparent electrode plates of the current invention is formed by ink-jet printing so as to form the organic flat emitting devices. Since the ink-jet printing can be accomplished by aligning, printing insulation material on specific areas on the transparent substrate, and curing, the number of steps can be reduced, and complicated and expensive machines are not necessary. Furthermore, since the usage of developer and stripper for lithography process is not necessary, environmental problems could be reduced. Moreover, photomasks and screens are not necessary. Therefore, not only the manufacturing cycle and cost can be reduced, but also the shape of the emitting patterns can be varied more freely.

The invention also provides manufacturing methods of transparent electrode plates including a transparent substrate, a plurality of transparent anodes, and an insulation layer. The manufacturing method includes a transparent anode forming step, an insulation layer forming step, and a curing step. In the transparent anode forming step, a plurality of separate transparent anodes are formed on the transparent substrate. In the insulation layer forming step, the insulation layer is formed around transparent anodes by ink-jet printing. In the curing step, the insulation layer is cured to form the transparent electrode plate.

Comparing with the conventional manufacturing methods, the insulation layer according to the invention is formed on the transparent substrate by ink-jet printing. Since the number of steps is reduced and the usage of photomasks and screens are not necessary, the manufacturing time and cost are reduced. Furthermore, since the usage of developer and stripper for lithography process is not necessary, environmental problems could be reduced. Hereinbelow is a table comparing the conventional manufacturing methods and the method according to the current invention:

| Item | First conventional process | Second conventional process | Third conventional process | This invention |
|---|---|---|---|---|
| Manufacture process | Lithography | Lithography | Screen printing | Ink-jet printing |
| Photomask/ screen | Necessary | Necessary | Necessary | Not necessary |
| Exposing, develop | Necessary | Necessary | Not necessary | Not necessary |
| Curing | Necessary | Necessary | Necessary | Necessary |
| Machines | More | More | Less | Less |
| Material usage rate | Low | Low | Moderate | High |
| Manufacture cycle | Long | Long | Short | Short |
| Environment problem | Big | Big | Big | Small |
| Manufacture cost | High | High | Low | Low |

BRIEF DESCRIPTION OF THE DRAWINGS

The invention will become more fully understood from the detailed description given in the herein below illustration, and thus are not limitative of the present invention, and wherein.

DETAILED DESCRIPTION OF THE PREFERRED EMBODIMENT

Figure 1:
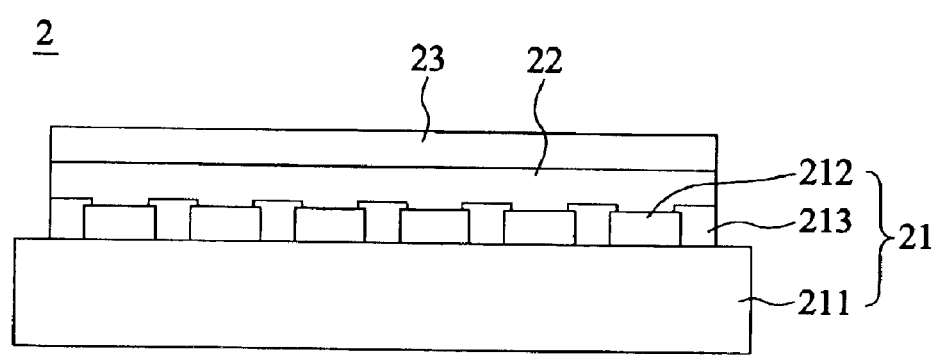
FIG. 1 is a schematic view showing the structure of the conventional organic flat emitting device.
Figure 2A:
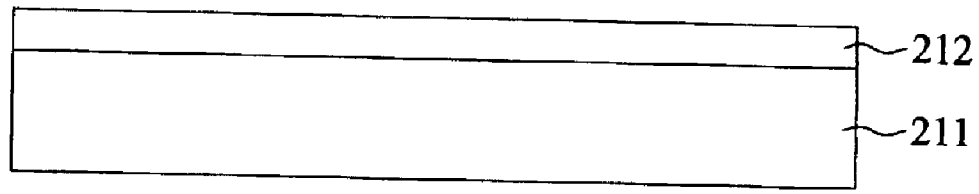
FIG. 2A to FIG. 2C are schematic diagrams illustrating the conventional manufacturing method of a transparent electrode plate.
Figure 2B:
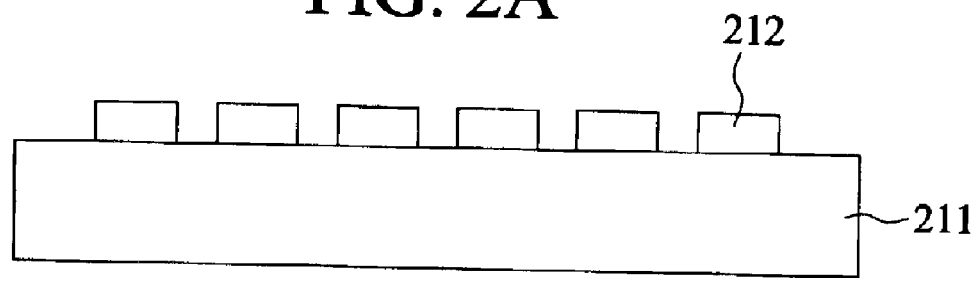
Figure 2C:
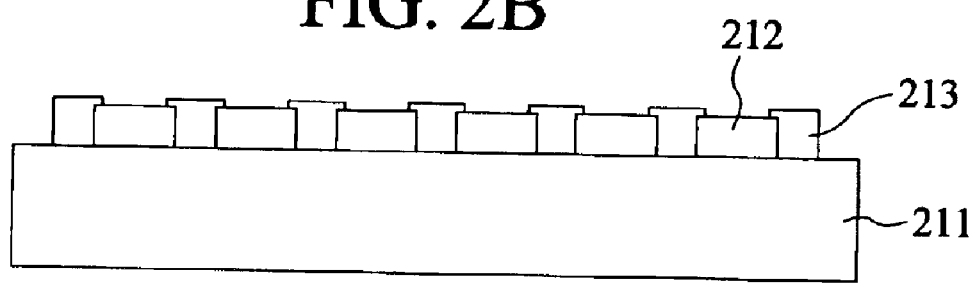
Figure 3:
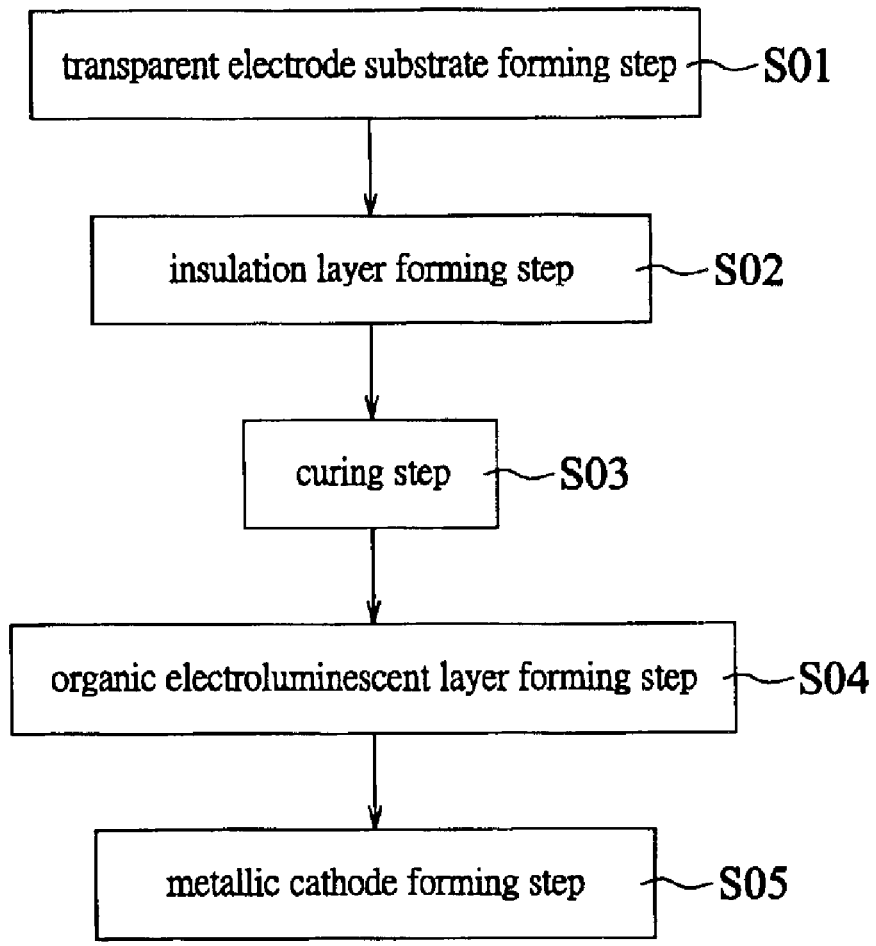
FIG. 3 is a block diagram showing a manufacturing method of an organic flat emitting device according to an embodiment of the invention.

The manufacturing methods of organic flat emitting devices and transparent electrode plates according to an embodiment of the invention will be described hereinbelow with reference to the accompany drawings, wherein the same reference numbers refer to the same elements.

Referring to FIG. 3 to FIG. 8, the manufacturing method of an organic flat emitting device 1 according to the present embodiment includes a transparent electrode substrate forming step (S01), an insulation layer forming step (S02), a curing step (S03), an organic electroluminescent layer forming step (S04), and a metallic cathode forming step (S05). In the transparent electrode substrate forming step, a plurality of separate transparent anodes 112 are formed on a transparent substrate 111. In the insulation layer forming step, an insulation layer 113 is formed around the transparent anode 112 by ink-jet printing. In the curing step, the insulation layer 113 is cured to form a transparent electrode plate 11. In the organic electroluminescent layer forming step, an organic electroluminescent layer 12 is formed on the transparent electrode plate 11 having the transparent anode 112 and the insulation layer formed thereon. In the metallic cathode forming step, metallic cathodes 13 are formed on the organic electroluminescent layer 12.

Figure 4A:
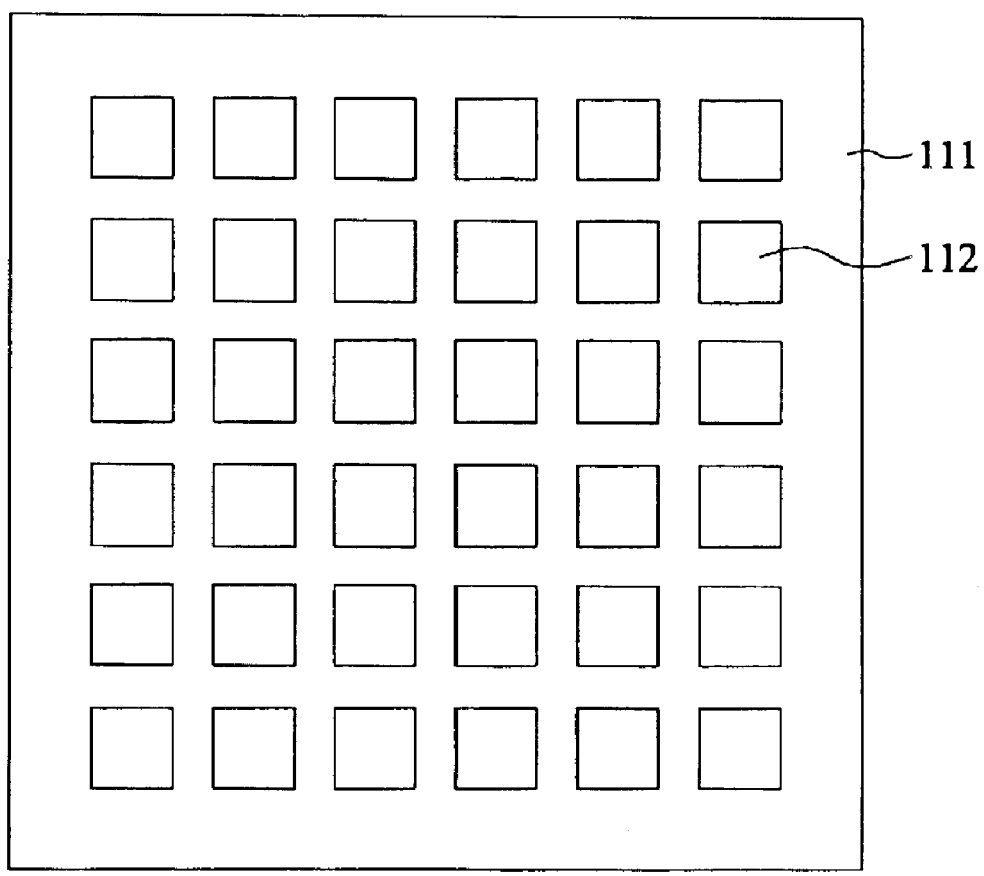
FIG. 4A and FIG. 4B are schematic diagrams showing a transparent electrode substrate forming step according to the embodiment of the invention.
Figure 4B:
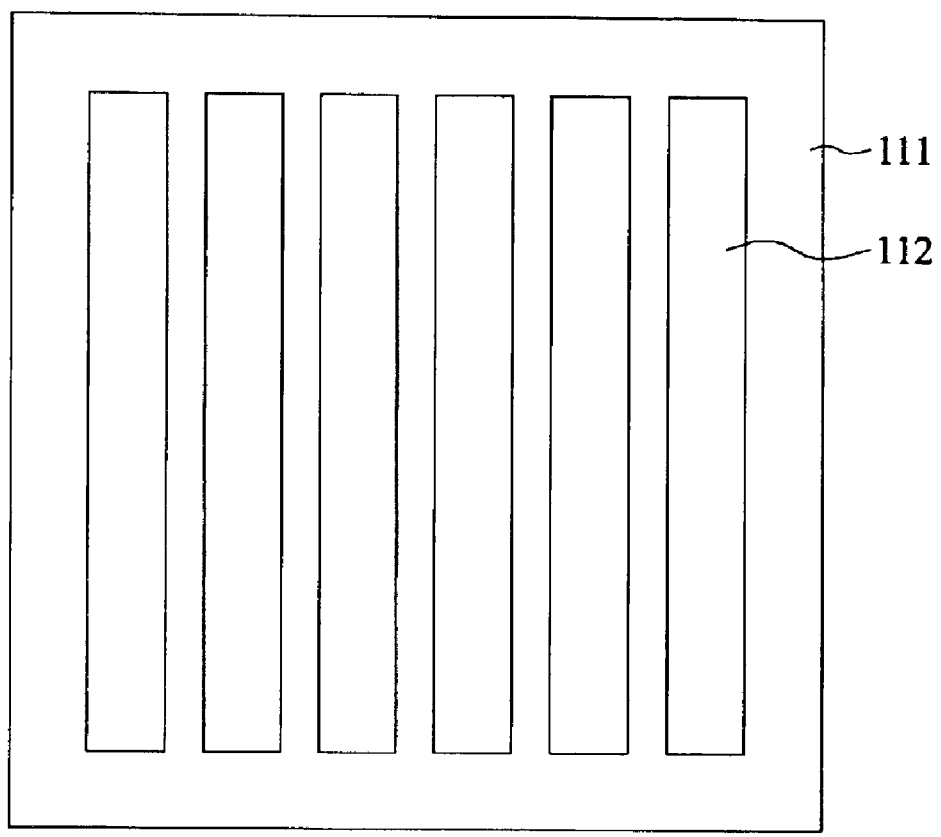

As shown in FIG. 4A, a plurality of separate transparent anodes 112 are formed on the transparent substrate 111 in step S01. In the present embodiment, the transparent substrate 111 may be a glass substrate, a plastic substrate, or a flexible substrate. The plastic substrate and the flexible substrate may be a PC (polycarbonate) substrate, a PET (polyester) substrate, a COC (cyclic olefin copolymer) substrate, or an mCOC (metallocene-based cyclic olefin copolymer) substrate. The transparent anodes 112 are formed on the transparent substrate 111 by sputtering or ion plating, and then forming its pattern by lithography. The transparent anodes 112 may be in shapes of slender bars as shown in FIG. 4B. The transparent anode 112 may be made of ITO or AZO, and have a thickness more than 500 Å.

Figure 5A:
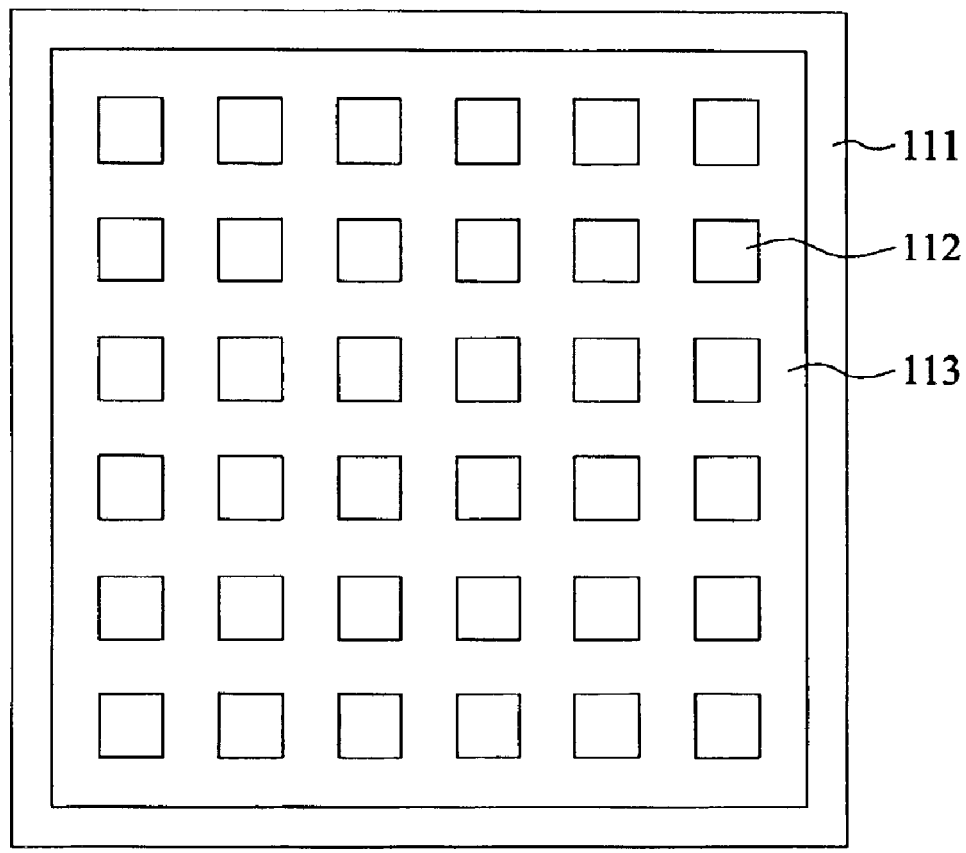
FIG. 5A and FIG. 5B are schematic diagrams showing an insulation layer forming step according to the embodiment of the invention.

As shown in FIG. 5A, in step S02, the insulation layer 113 is formed around the separate transparent anodes 112 by ink-jet printing. When forming the insulation layer 113, at least one ink-jet head is used to jet insulation material after aligned with the area around the transparent anodes 112 to form the insulation layer 113 around the transparent anodes 112. The ink-jet head has at least one ink-jet hole (not shown).

Figure 5B:
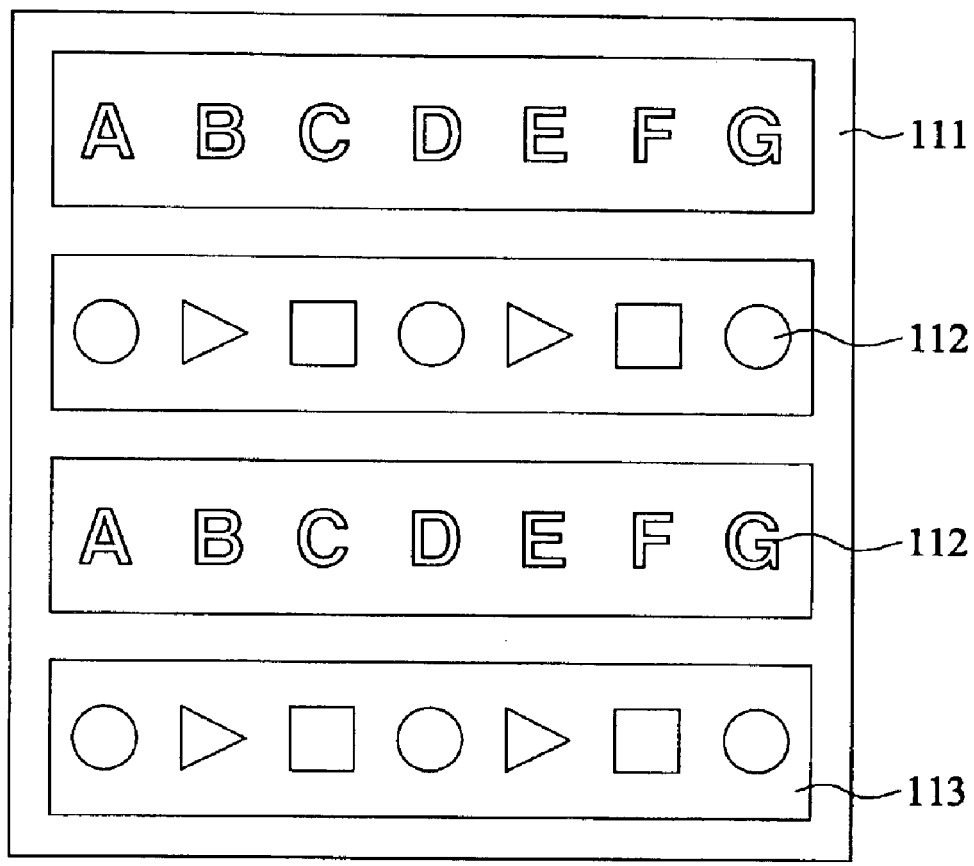

Referring to FIG. 5B, in the present embodiment, the insulation layer may be formed to have arbitrary shapes by ink-jet printing in view of practical requirements, such as characters or irregular shapes. The advantage is that photomasks or screens are not necessary. Compared to the conventional complex steps, the same effect can be achieved by ink-jet printing, which is less complicated.

The insulation layer 113 is made of photosensitive polymer insulation material, and is used to define the size and shape of the light source area and to avoid the non-uniform electric field at the edge of the transparent anode 112, which may reduce the lifetime of the device. The insulation layer 113 may have a thickness of more than 0.05 micrometer, a resistance of more than 106 ohm-cm, and a characteristic dimension (line width or line distance) of more than 20 micrometers.

Furthermore, the size and shape of the inkjet head may be varied in view of the size of the pattern to be printed and the properties of the insulation material, such as the viscosity and/or the particle size. The way of alignment may also be varied according to the precision requirement of the pattern of the insulation layer. For example, if the alignment precision requirement is more than 50 micrometers, mechanical alignment may be used. For the alignment precision requirement of more than 1 micrometer, optical alignment may be used.

In the present embodiment, photosensitive polymer insulation material may be PSPI (photosensitive polyimide), in which photosensitive radical is introduced into the main structure of polyimide, so that the polyimide could have the properties of both the insulation layer and the photoresist. According to its molecule structure and its reaction type, PSPI may be divided into Ring Opened Negative Type PSPI, Ring Closed Negative Type PSPI, Ring Opened Positive Type PSPI, and Ring Close Positive Type PSPI. Using PSPI during process can reduce the steps and the photoresist material required, and is thus helpful for improving yield and reducing cost.

Figure 6:
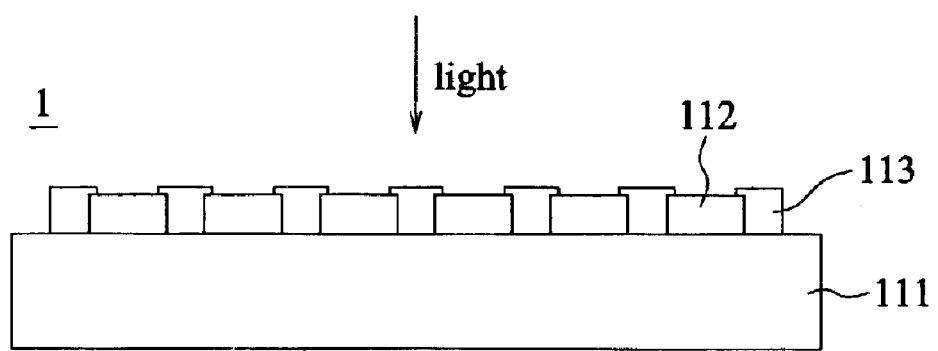
FIG. 6 is a schematic diagram showing a curing step according to the embodiment of the invention.

Furthermore, as shown in FIG. 6, the step S03 is for curing the insulation layer 113. Since the insulation material is photosensitive, the insulation layer can be cured by a light exposing process. Appropriate light (such as UV light) and exposing dose could be used for curing to form the transparent electrode plate 11.

Figure 7:
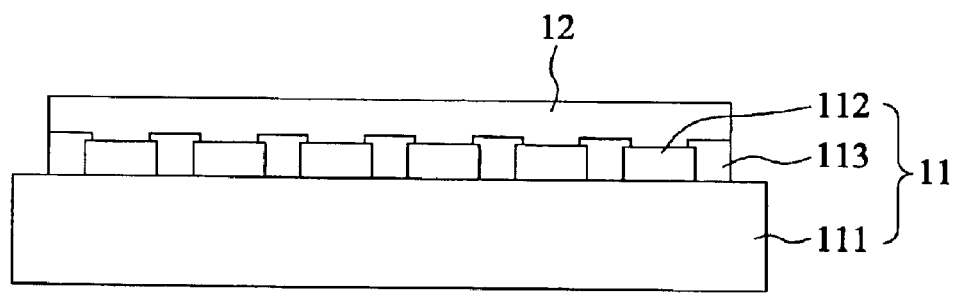
FIG. 7 is a schematic diagram showing an organic electroluminescent layer forming step according to the embodiment of the invention.

Referring to FIG. 7, in step S04, an organic electroluminescent layer 12 is formed on the transparent electrode plate 11 having the transparent anode 112 and the insulation layer 113 formed thereon. The organic electroluminescent layer 12 may be formed by evaporation, spin-coating, ink-jet printing or screen-printing. The organic electroluminescent layer 12 may emit blue light, green light, red light, white light, or other monochrome, and may have a thickness of about 500 Å to 3000 Å.

Figure 8:
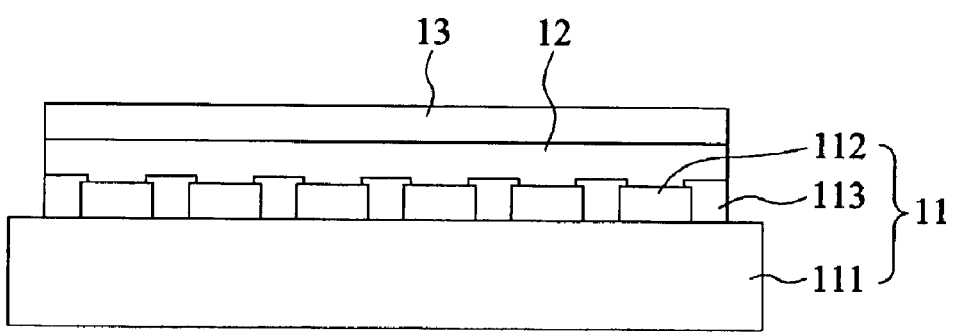
FIG. 8 is a schematic diagram showing a metallic cathode forming step according to the embodiment of the invention.

As shown in FIG. 8, in step S05, a metallic cathode 13 is formed on the organic electroluminescent layer 12. The metallic cathode 13 may be formed by evaporation or sputtering, and may be made of aluminum, aluminum/lithium, calcium, magnesium/silver or silver, and may have a thickness of about 500 Å to 5000 Å.

Figure 9:
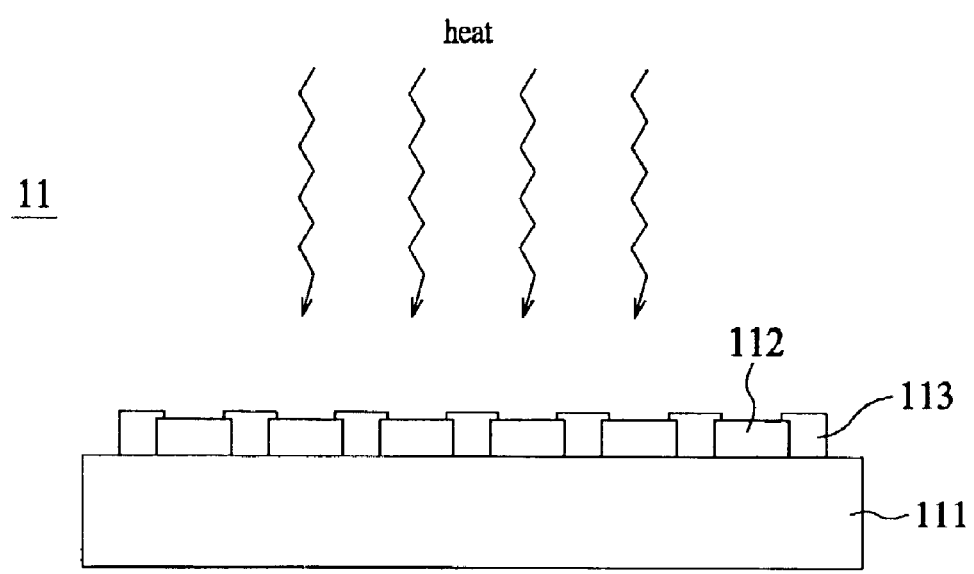
FIG. 9 is a schematic diagram showing a curing step according to another embodiment of the invention.

Another embodiment of the invention will be described hereinbelow. In this case, the insulation layer is made of non-photosensitive polymer material, and other elements and features of this embodiment are the same to the previous embodiment. As shown in FIG. 9, since the insulation layer is made of non-photosensitive polymer material, the curing step is accomplished by heating. The insulation layer 113 is heated under appropriate temperature and time to form the transparent electrode plate 11, so as to form the organic flat emitting device 1.

Without using photomasks and screens, ink-jet printing can form the pattern required, such as squares, characters, or irregular shapes, using less liquid material on a substrate in fewer steps. Therefore, the period required from product design to mass production could be significantly reduced. Based on this feature, the invention uses ink-jet printing technology to form insulation layers on the transparent substrate, so as to form the organic flat emitting device. Compared with the conventional manufacturing methods, using ink-jet printing to form insulation layers not only reduces the manufacturing cost and time, but also leaves out the usage of developer and stripper, which avoids environmental pollution problems.

A manufacturing method of a transparent electrode plate according to an embodiment of the invention will be described hereinbelow with reference to FIG. 10, wherein the same reference number denotes the same element. Detailed descriptions regarding steps that are the same to the previous embodiment will be omitted for make the description more concise and clear.

Figure 10:
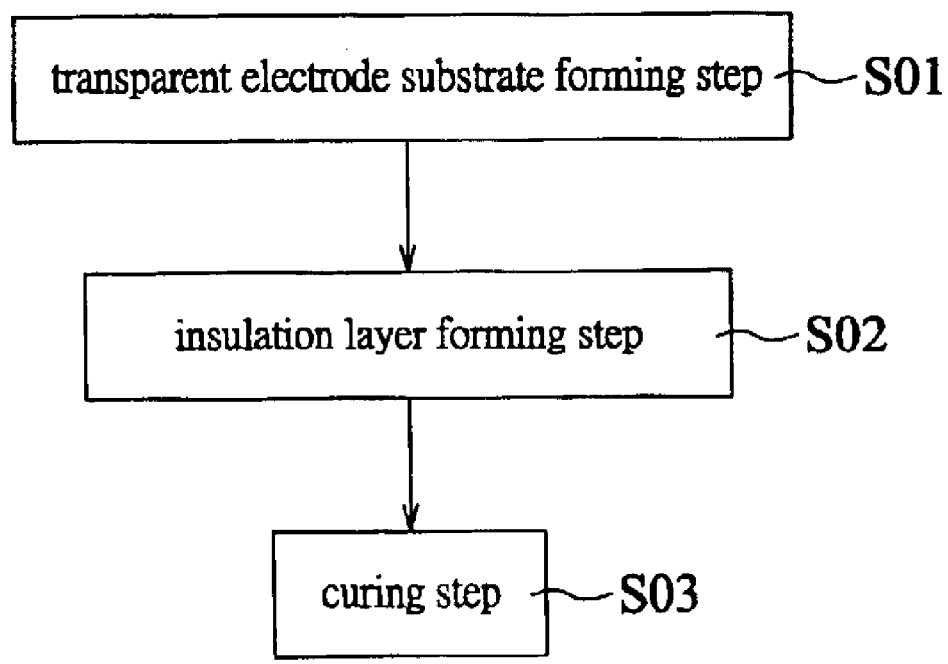
FIG. 10 is a block diagram showing the manufacturing method of a transparent electrode plate according to another embodiment of the invention.

As shown in FIG. 10, the manufacturing method of a transparent electrode plate according to the present embodiment of the invention includes a transparent anode forming step (S01), an insulation layer forming step (S02) and a curing step (S03). In the transparent electrode substrate forming step, a plurality of separate transparent anodes 112 are formed on a transparent substrate 111. In the insulation layer forming step, an insulation layer 113 is formed around the transparent anode 112 by ink-jet printing. In the curing step, the insulation layer 113 is cured to form a transparent electrode plate 11.

In view of the above, in this embodiment, the insulation layer is formed on the transparent substrate by accomplishing three steps only, namely, the alignment, the ink-jet printing, and the curing. Developer and stripper for lithography process are not necessary. Therefore, environmental problems could be reduced. Furthermore, using ink-jet printing technology, the insulation layer may be formed to have arbitrary shapes according to practical requirements, such as characters or irregular shapes. The complicated processes are not needed, and the manufacturing cost and time can be reduced.

While the invention has been described with reference to a preferred embodiment, this description is not intended to be construed in a limiting sense. Various modifications of the embodiment will be apparent to persons skilled in the art upon reference to the description. It is therefore intended that the appended claims encompass any such modifications.

What is claimed is:

1. A manufacturing method of organic flat emitting devices, wherein the organic flat emitting devices comprise a transparent electrode plate, an organic electroluminescent layer, and a metallic cathode, the method comprising the steps of:

forming a plurality of separate transparent anodes on a transparent substrate;

forming an insulation layer around the transparent anodes by ink-jet printing, the ink-jet printing being accomplished by using at least one ink-jet head to jet insulation material after aligning with an area around the transparent anodes so as to form the insulation layer around the transparent anodes, the aligning being accomplished by mechanical aligning having an aligning precision of no less than about 50 micrometer or the aligning being accomplished by optical aligning having an aligning precision of no less than about 1 micrometer;

curing the insulation layer to form the transparent electrode plate;

forming the organic electroluminescent layer on the transparent electrode plate having the transparent anodes and the insulation layer; and coating the metallic cathode on he organic electroluminescent layer.

2. The method of claim 1, wherein the transparent anodes are conductive metal oxide anodes.

3. The method of claim 1, wherein the thickness of the transparent anodes is no less than 500 Å.

4. The method of claim 1, wherein the insulation layer comprises a photosensitive polymer material.

5. The method of claim 1, wherein the insulation layer comprises a non-photosensitive polymer material.

6. The method of claim 1, wherein the thickness of the insulation layer is no less than about 0.05 micrometer.

7. The method of claim 1, wherein the resistance of the insulation layer is no less than about $10^6$ ohm-cm.

8. The method of claim 1, wherein the characteristic dimension of the insulation layer is no less than about 20 micrometer.

9. The method of claim 1, wherein the ink-jet head has at least one inkjet hole.

10. The method of claim 1, wherein the thickness of the organic electroluminescent layer is about 500 Å to about 5000 Å.

11. The method of claim 1, wherein the thickness of the metallic cathode is about 500 Å to about 5000 Å.

12. A manufacturing method of a transparent electrode plates, wherein the transparent electrode plates include a transparent substrate, a plurality of transparent anodes, and an insulation layer, the process comprising the steps of:

forming the plurality of separate transparent anodes on the transparent substrate;

forming the insulation layer around the transparent anodes by ink-jet printing, the ink-jet printing being accomplished by using at least one ink-jet head to jet insulation material after aligning with an area around the transparent anodes so as to form the insulation layer around the transparent anodes, the aligning being accomplished by mechanical aligning having an aligning precision of no less than about 50 micrometer or the aligning being accomplished by optical aligning having an aligning precision of no less than about 1 micrometer; and curing the insulation layer to form the transparent electrode plate.

13. The method of claim 12, wherein the transparent anodes are conductive metal oxide anodes.

14. The method of claim 12, wherein the insulation layer comprises a photosensitive polymer material.

15. The method of claim 12, wherein the insulation layer comprises a non-photosensitive polymer material.

16. The method of claim 12, wherein the thickness of the insulation layer is no less than about 0.05 micrometer.

17. The method of claim 12, wherein the resistance of the insulation layer is no less than about $10^6$ ohm-cm.

18. The method of claim 12, wherein the characteristic dimension of the insulation layer is no less than about 20 micrometer.

19. The method of claim 12, wherein the ink-jet head has at least one ink-jet hole.

* * * * *